(12) United States Patent
Rey (10) Patent No.: US 7,298,808 B1
(45) Date of Patent: Nov. 20, 2007

(54) CASCADED JITTER FREQUENCY SHIFTING Δ-Σ MODULATED SIGNAL SYNCHRONIZATION MAPPER

(75) Inventor: Claudio Gustavo Rey, Stittsville (CA)

(73) Assignee: PMC-Sierra, Inc., Santa Clara, CA (US)

( * ) Notice: Subject to any disclaimer, the term of this patent is extended or adjusted under 35 U.S.C. 154(b) by 829 days.

(21) Appl. No.: 10/424,718

(22) Filed: Apr. 29, 2003

(51) Int. Cl.
*H04L 25/00* (2006.01)
*H04L 7/00* (2006.01)

(52) U.S. Cl. .................. 375/372; 375/373; 375/343

(58) Field of Classification Search ............ 375/326, 375/327, 356, 359, 362, 371, 375, 376
See application file for complete search history.

(56) References Cited

U.S. PATENT DOCUMENTS

| | | | |
|---|---|---|---|
| 4,791,652 A | | 12/1988 | McEachern et al. |
| 4,845,711 A | * | 7/1989 | LeFort et al. ............... 370/242 |
| 5,067,126 A | | 11/1991 | Moore |
| 5,268,936 A | | 12/1993 | Bernardy |
| 5,274,375 A | * | 12/1993 | Thompson ................. 341/143 |
| 5,337,315 A | | 8/1994 | Ehrlich |
| 5,563,891 A | | 10/1996 | Wang |
| 5,619,506 A | | 4/1997 | Burch et al. |
| 5,751,777 A | * | 5/1998 | Zampetti .................... 375/376 |
| 5,910,753 A | | 6/1999 | Bogdan |
| 5,910,960 A | * | 6/1999 | Claydon et al. ............ 714/784 |
| 6,819,725 B1 | * | 11/2004 | Oliver et al. ............... 375/371 |
| RE39,216 E | * | 8/2006 | Worsley et al. ......... 370/395.53 |
| 2004/0062278 A1 | * | 4/2004 | Hadzic et al. .............. 370/503 |
| 2004/0071251 A1 | * | 4/2004 | Sutioso et al. ............. 375/373 |

FOREIGN PATENT DOCUMENTS

CA 2316443 2/2002

OTHER PUBLICATIONS

Tom A.D. Riley, Miles A. Copeland and Tad A. Kwasniewski, "Delta-Sigma Modulation in Fractional-N Frequency Synthesis," IEEE Journal of Solid-State Circuits Vol. 28, No. 5, May 1993, pp. 553-559.

* cited by examiner

*Primary Examiner*—Chieh M. Fan
*Assistant Examiner*—Qutub Ghulamali
(74) *Attorney, Agent, or Firm*—Oyen Wiggs Green & Mutala LLP (57) ABSTRACT

The invention provides a synchronizer incorporating a Δ-Σ modulator (i.e. a bit stuffing command generator), coupled in series with a frequency offset measurement block and a frequency-locked loop, to synchronize the data rate of an output data stream to that of an input data stream such that jitter energy is shifted up in frequency, simplifying attenuation of the jitter energy when the output data stream is desynchronized (demapped). Placement of the Δ-Σ modulator outside the frequency-locked loop allows selectable adjustment of the frequency offset measurement block's frequency. A mapper incorporating the Δ-Σ modulator interprets the pulse train output by the Δ-Σ modulator as stuff/null/de-stuff commands.

9 Claims, 5 Drawing Sheets

CASCADED JITTER FREQUENCY SHIFTING Δ-Σ MODULATED SIGNAL SYNCHRONIZATION MAPPER

TECHNICAL FIELD

This invention pertains to minimization of low frequency jitter during bit stuff mapping of plesiochronous data signals into synchronized data signals.

BACKGROUND

Figure 1:
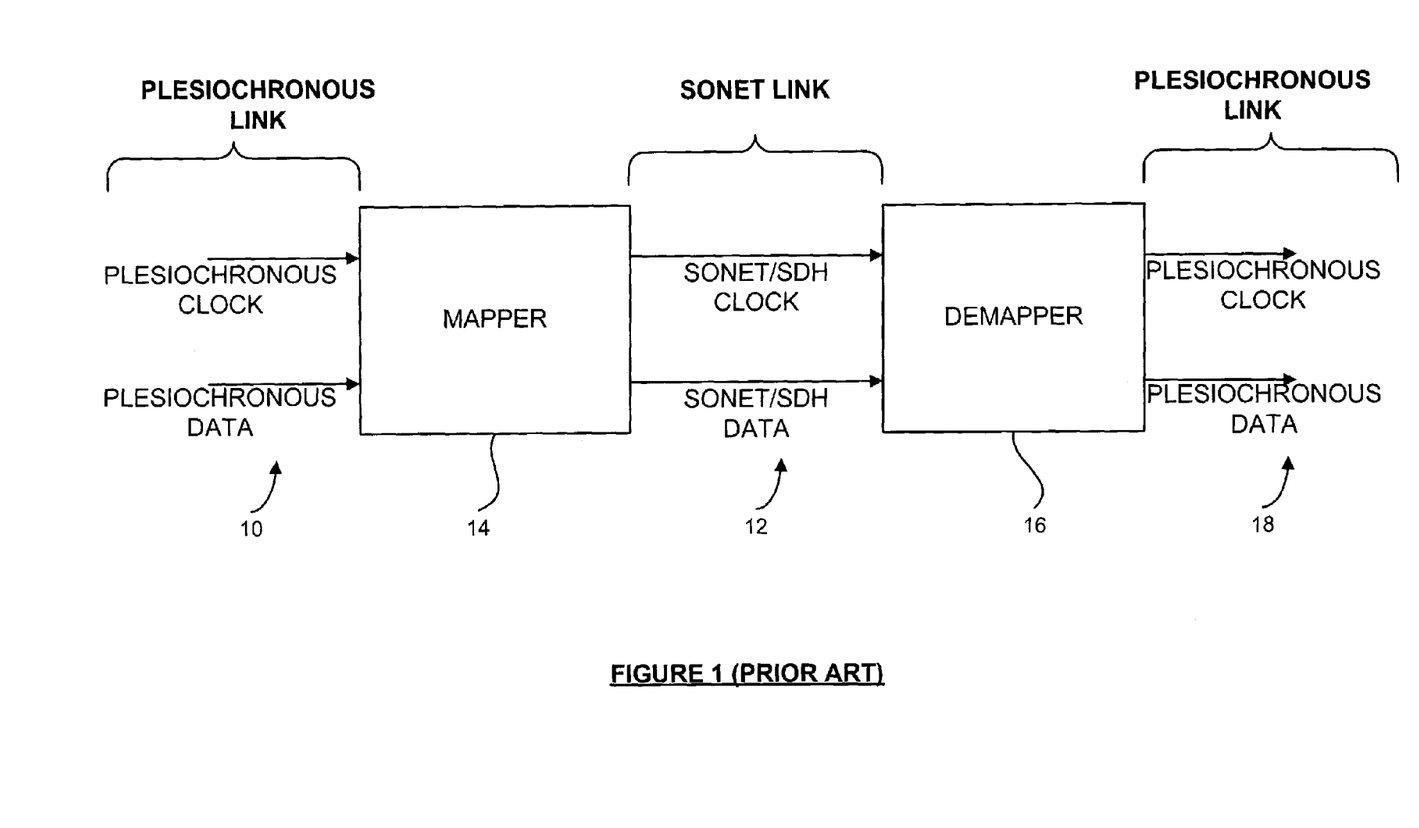
FIG. 1 schematically depicts prior art mapping of signals from a plesiochronous link for transmission on a SONET/SDH link and subsequent demapping of the signals on the SONET/SDH link for transmission on another plesiochronous link.

"Bit stuffing" is a well known technique used in synchronizing data signals by "mapping" such signals from one data rate to a different data rate. For example, as shown in FIG. 1, plesiochronous signals, such as DS-1, DS-2 or DS-3 signals respectively characterized by 1.544 Mb/s, 6.312 Mb/s or 44.736 Mb/s clock rates, are commonly mapped from a plesiochronous link 10 to a SONET/SDH link 12 having a different characteristic clock rate, such as the 1.728 Mb/s rate of the SONET VT1.5 signal. An electronic device known as a "mapper" 14 performs the mapping operation. After transmission over SONET/SDN link 12, the signal is desynchronized (demapped) by "demapper" 16 which reconverts the SONET/SDH signal to a plesiochronous signal for transmission over another plesiochronous link 18.

The bit stuffing technique involves insertion ("stuffing") of positive or negative bits into the data stream during the mapping operation. If these bit "stuffs" are performed in a regular and efficient manner they impose unacceptable low frequency jitter on the mapped data stream. It is very difficult to remove such low frequency jitter when the data stream is desynchronized (demapped), particularly in older "legacy" systems utilizing 40 Hz jitter filters. Consequently, the prior art has evolved various bit stuffing techniques for minimizing low frequency jitter by translating jitter energy to higher frequencies at which it is more easily removed.

One prior art technique utilizes phase lock loops (PLLs) incorporating voltage controlled oscillators (VCOs) having frequency characteristics governed by the level of a FIFO buffer (sometimes called an "elastic store") through which the data stream is processed. However, VCO-based PLL techniques involve comparatively expensive analog circuitry.

In another prior art technique known as "threshold modulation" the sawtooth-like characteristic of the FIFO buffer fill level is monitored and used to perform dithering of the bit stuffing operation. This requires monitoring of the FIFO buffer depth, and access to the FIFO buffer pointers. Moreover, the frequency of the aforementioned sawtooth characteristic affects the higher frequency band into which the jitter energy is translated, constraining circuit design if the sawtooth frequency is fixed. Stuff requests are produced on the basis of phase comparisons relative to a threshold level which is cyclically varied or modulated with a waveform having the same period as the stuffing "superframe." The phase comparison is governed by the elastic store write and read address pointers.

U.S. patent application Ser. No. 09/641,980 filed 21 Aug. 2000 and assigned to the assignee of the present invention (the '980 application), discloses a jitter frequency shifting "delta-sigma" (Δ-Σ) modulated signal synchronization mapper which utilizes a deltasigma synchronizer (DSS) containing a Δ-Σ modulator that functions as a notional voltage controlled oscillator (VCO) to synchronize the data rate of an output data stream to that of an input data stream such that jitter energy is shifted up in frequency, thereby simplifying attenuation of the jitter energy when the data stream is desynchronized (demapped). The '980 application's Δ-Σ modulator is integrally coupled within a frequency-locked loop (FLL)—a leading lowpass filter and the Δ-Σ modulator form a coupled loop control circuit.

The '980 application's DSS is constrained in that the Δ-Σ modulator is inside the loop of the PLL. This does not allow flexibility in selecting the frequency offset measurement frequency. This may present a problem in systems that employ a relatively slow bit-stuffing clock, as the waiting time jitter generated by the phase detector (frequency offset measurement block) could become significantly large.

This invention seeks to address or at least ameliorate the foregoing problems. Unlike the aforementioned threshold modulation technique, this invention (like that described in the '980 application) utilizes direct measurement of the frequency offset between a recovered line clock and a system clock, with no threshold modulation based on generation of bit stuff commands.

SUMMARY OF INVENTION

In a broad form, the invention utilizes a synchronizer which includes a Δ-Σ modulator (i.e. a stuffing generator), coupled in series with a frequency offset measurement block and a measurement low pass filter, to synchronize the data rate of an output data stream to that of an input data stream such that jitter energy is shifted up in frequency, simplifying attenuation of the jitter energy when the output data stream is desynchronized (demapped). Frequency offset is measured by counting the number of excess or missing line clock edges within a measurement period. The measured frequency offset is then filtered by a digital frequency-locked loop (DFLL), which attenuates jitter. More particularly, the Δ-Σ modulator produces stuff/null/de-stuff commands based on the DFLL's output. Pulse-stuffing/waiting time jitter (caused by quantization introduced by the frequency offset measurement) is attenuated by the DFLL, which functions as a measurement filter.

In a preferred form of the invention the Δ-Σ modulator is not part of any FLL, thereby allowing greater design flexibility. The Δ-Σ modulator (i.e. stuffing generator) generates an accurate pulse train which a mapper incorporating the Δ-Σ modulator interprets as stuff/null/de-stuff commands.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense. In the Figures, incorporated to illustrate features of the present invention, like reference numerals are used to identify like parts throughout.

Figure 2:
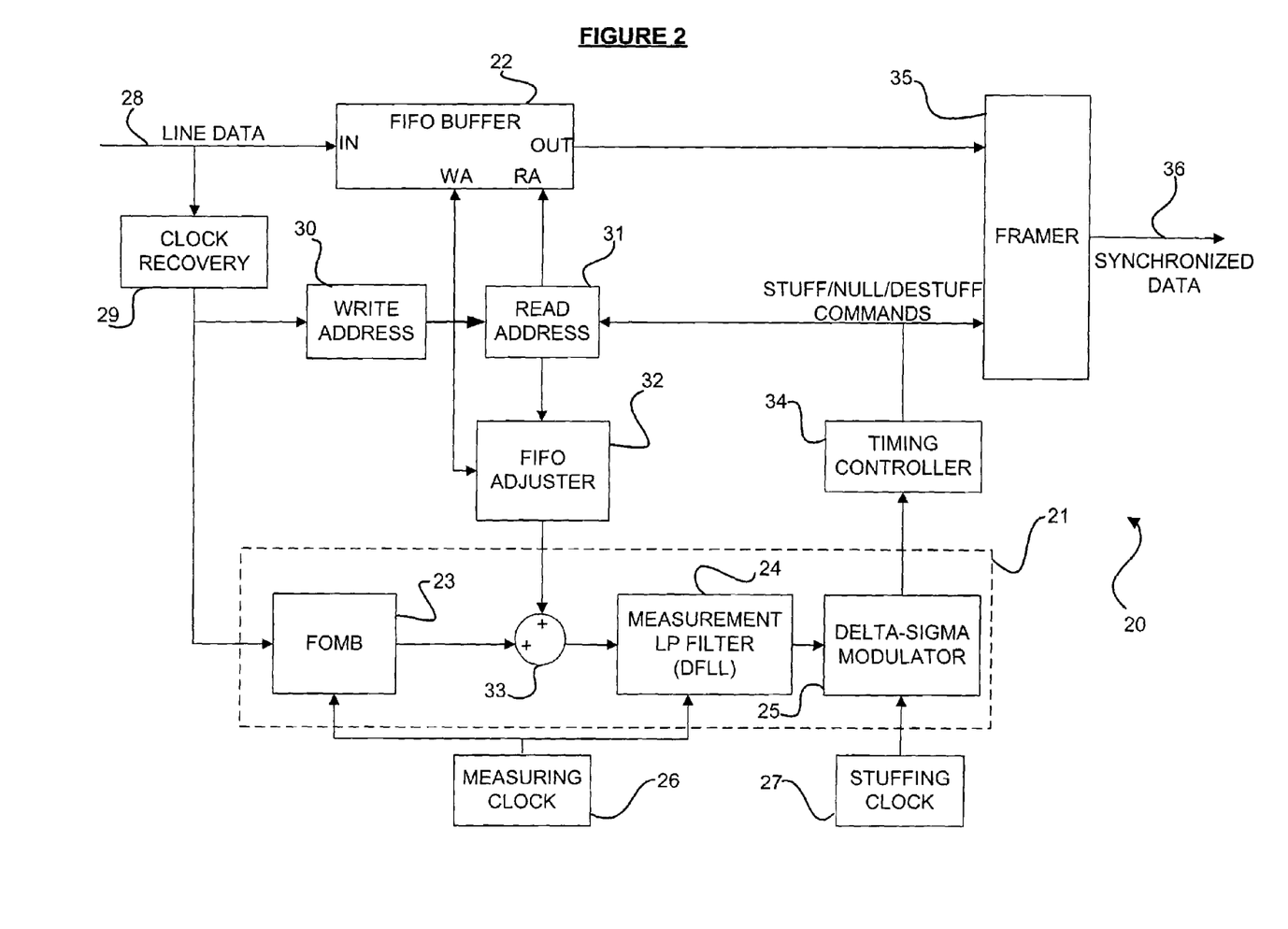
FIG. 2 is a block diagram representation of a mapper incorporating a synchronizer in accordance with the invention.

FIG. 2 depicts the architecture of mapper 20 in block diagram form. Mapper 20 incorporates a novel Δ-Σ synchronizer (DSS) 21 for controlling the level of FIFO buffer 22.

DSS 21 in turn incorporates frequency offset measurement block (FOMB) 23, measurement low pass filter 24 (i.e. a digital frequency-locked loop—DFLL) and Δ-Σ modulator 25 (i.e. bit stuffing command generator) in a series arrangement. FOMB 23 measures the relative difference (frequency offset) between the frequency of measurement (i.e reference) clock 26 and the frequency of the clock signal derived by clock recovery circuit 29 from the signal input on line 28. The quantizing nature of FOMB 23's frequency offset measurement necessarily introduces jitter, which is reduced by measurement low-pass filter 24. Filter 24 also prevents aliasing when the frequency offset measurement is translated into stuffing commands. Δ-Σ modulator 25 compensates for the frequency offset between the system (i.e. reference) and recovered clocks, as well as for any other frequency offset caused by the mapping operation. Δ-Σ modulator 25 quantizes its commands to produce valid stuffing integers without any bias in roundoff error. FIFO buffer adjuster 32 forces correction of DSS 21's accounting as FIFO buffer 22 approaches its full (or empty) level. Such correction is unnecessary if DSS 21 is operating within a pre-determined tracking range, but may be useful to attain fast synchronization in an extreme case, if DSS 21 loses its frequency lock. Measurement clock 26 and stuffing clock 27 are derived from the same network system clock and hence are synchronized.

Plesiochronous input data line 28 is coupled to FIFO buffer 22. Clock recovery circuit 29 derives a recovered clock signal representative of the frequency of the signal input on line 28, as previously explained. The recovered clock signal is passed to write address generator 30 and to FOMB 23. Write address generator 30 and read address generator 31 are coupled to FIFO buffer 22 and to FIFO adjuster 32. The output of FIFO adjuster 32 is applied to adder 33, which also receives the output signal produced by FOMB 23. DSS 21 outputs stuff/null/destuff commands to timing controller 34, based on the signal output by DFLL 24. Timing controller 34 forwards the commands to read address generator 31 and to framer 35. Data is read out of FIFO buffer 22 and passed to framer 35, which outputs synchronized data 36.

Adder 33 normally outputs 0. But, if DSS 21 is unable to track the frequency offset between the recovered and reference clocks, adder 33 outputs a value representative of the offset between the read and write pointers, which may be substantial. The FIFO level is thus controlled so that it neither rises above nor drops below pre-defined thresholds. If the FIFO level is not within those thresholds (which is unusual), FIFO adjuster 32 outputs a number which is added to DFLL 24's internal integrator (formed by adder 52 and delay element 53 shown in FIG. 5) in order to reflect the FIFO fill level.

FOMB 23 measures the input frequency offset by counting the number of excess or missing line clock edges within a measurement period. A simple interval counter can be used to perform this function. The measured frequency offset is then filtered by DFLL 24, to attenuate jitter as aforesaid. Note that unlike the invention described in the '980 application, which places the Δ-Σ modulator inside a phase-locked loop, this invention cascades Δ-Σ modulator 25 after the DFLL loop.

Figure 3:
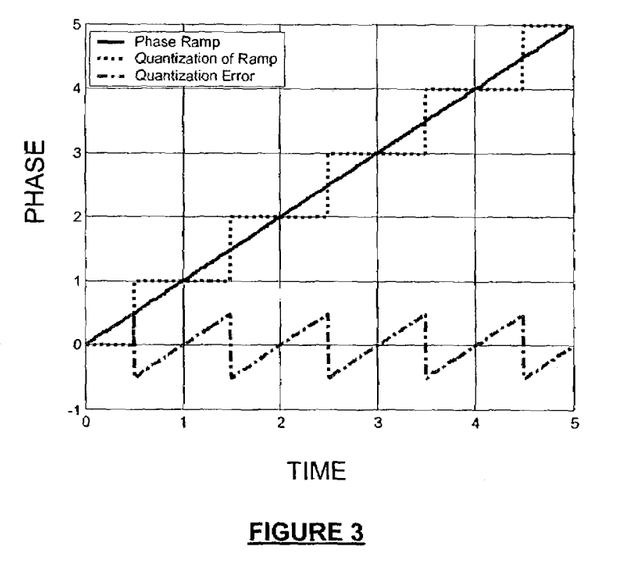
FIG. 3 graphically depicts an example of the pulse stuffing/waiting time jitter. The solid line represents the phase ramp; the dotted line represents quantization of the phase ramp; and, the dashed-dotted line represents the quantization error as a function of time.

Quantization error introduced by FOMB 23 (i.e. pulse stuffing/waiting time jitter) has a sawtooth characteristic, represented by the dashed-dotted line in FIG. 3. More particularly, pulse stuffing/waiting time jitter is caused by the quantization error of a phase ramp measured in Units Intervals (UIs) of the sampling clock. The phase ramp (solid line in FIG. 3) is a consequence of the frequency offsets between the recovered and reference clocks. The pulse stuffing/waiting time jitter constitutes the subtraction of the phase ramp from its quantized version (dotted line in FIG. 3). The jitter signal's sawtooth characteristic can be described in terms of a Fourier series having a fundamental frequency dependant on the frequency offset and the line clock rate $f_1$. DSS 21 samples the sawtooth signal at FOMB 23's sampling rate $f_s$. A frequency offset measured in parts-per-million (ppm) produces a sawtooth signal with a fundamental period T given by:

$$T = \frac{10^6}{ppm \cdot f_1} \quad (1)$$

A sawtooth waveform $saw_1(t)$ can be represented in continuous time as a Fourier series:

$$saw_1(t) = -\frac{1}{\pi}\sum_{n=1}^{\infty}\frac{(-1)^n}{n}\sin\left(\frac{2n\pi t}{T}\right) \quad (2)$$

having an amplitude measured in UIs where one $UI=1/f_1$ seconds.

The sawtooth pattern spectrum decays slowly as the frequency increases. Since the sawtooth waveform is sampled at a rate determined by FOMB 23, which is not related to the fundamental frequency, the decay of the Fourier series will alias "in band" as shown in FIG. 4.

Figure 4:
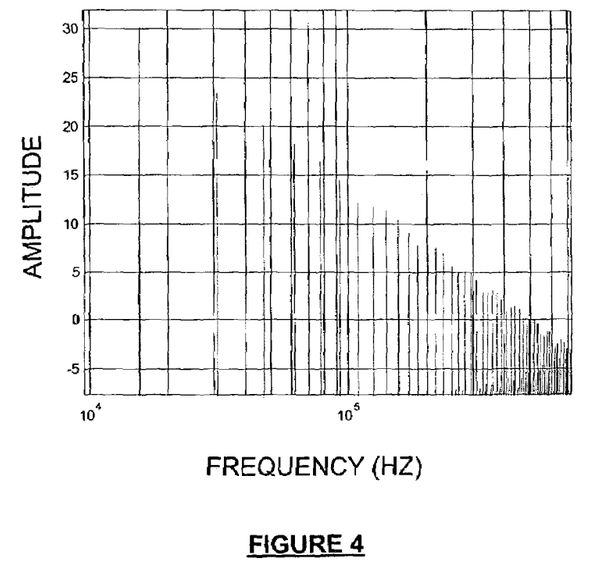
FIG. 4 graphically depicts an exemplary input quantization power spectrum for the invention, showing the amplitude of the quantization jitter (dB) as a function of frequency (Hz) in a linear vs. logarithmic plot.

The quantization jitter (also known as "pulse stuffing" or "waiting time" jitter) spectrum shown in FIG. 4 is for a 50 ppm frequency offset with a sampling rate of 1.44 MHz. Equation (1) thus yields a fundamental frequency of 15.5 kHz. Note the 20 dB-per-decade decay of the spectrum and the aliasing back of the jitter spectrum.

To minimize the aliased spectrum, the measurement frequency should be as high as possible. The approach taken in the '980 application is to equate the measurement frequency to that of the stuffing command generator (Δ-Σ modulator). In some applications, the frequency of stuffing clock 27 is sufficiently high that the resultant waiting time jitter is small. This invention allows the frequency of FOMB 23 to be selectably increased, which is advantageous.

As previously explained, DFLL 24 filters (attenuates) pulse-stuffing/waiting time jitter caused by FOMB 23's quantizing frequency offset measurement. The effectiveness of DFLL 24's filtration depends on the ppm offset. Very small offsets are not filtered out well, especially if the fundamental falls between the cutoff frequency of the DFLLs in mapper 20 and the corresponding demapper (not shown).

Figure 5:
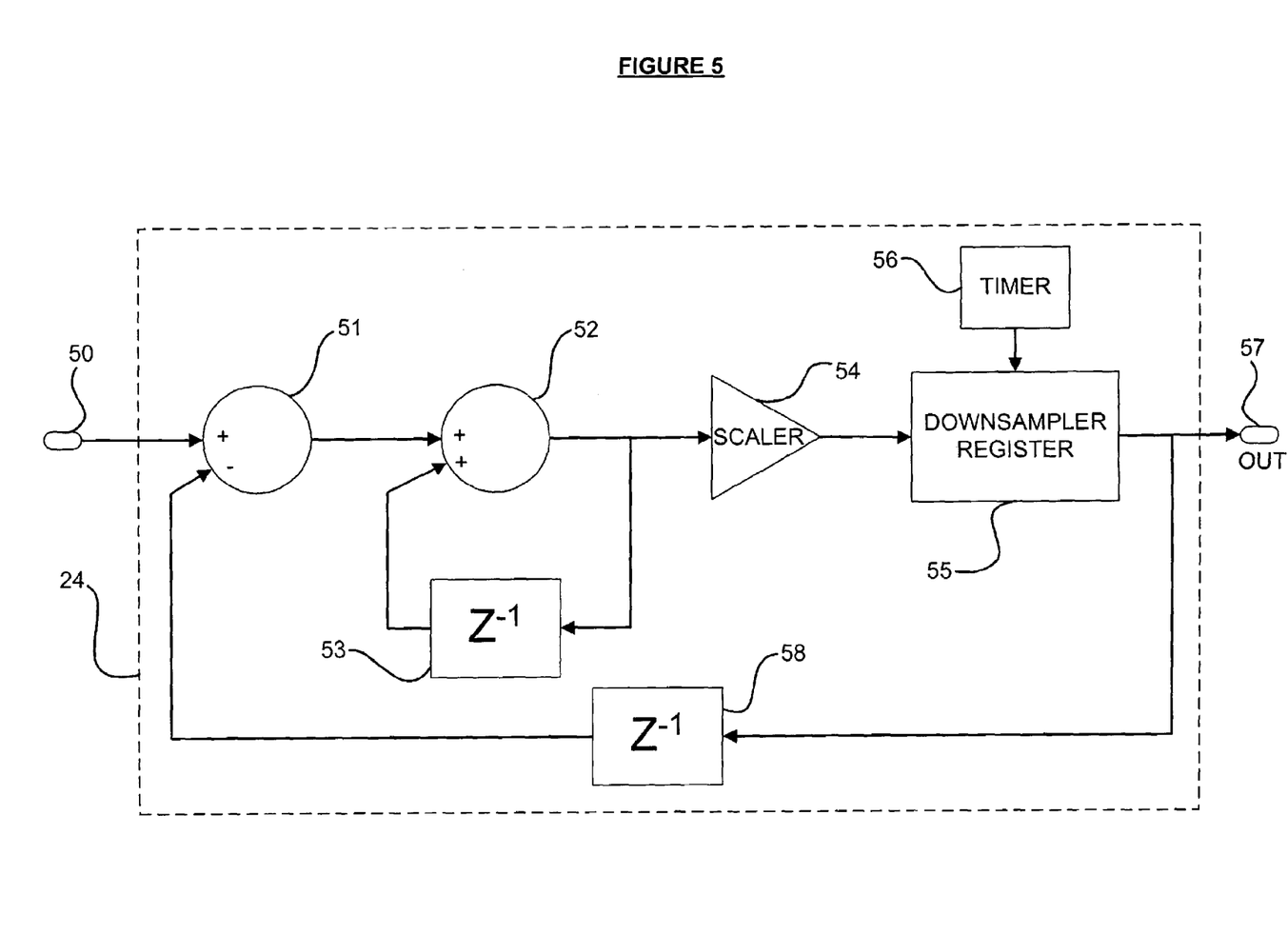
FIG. 5 is a block diagram representation of the measurement low pass filter of the synchronizer in accordance with the invention.
Figure 6:
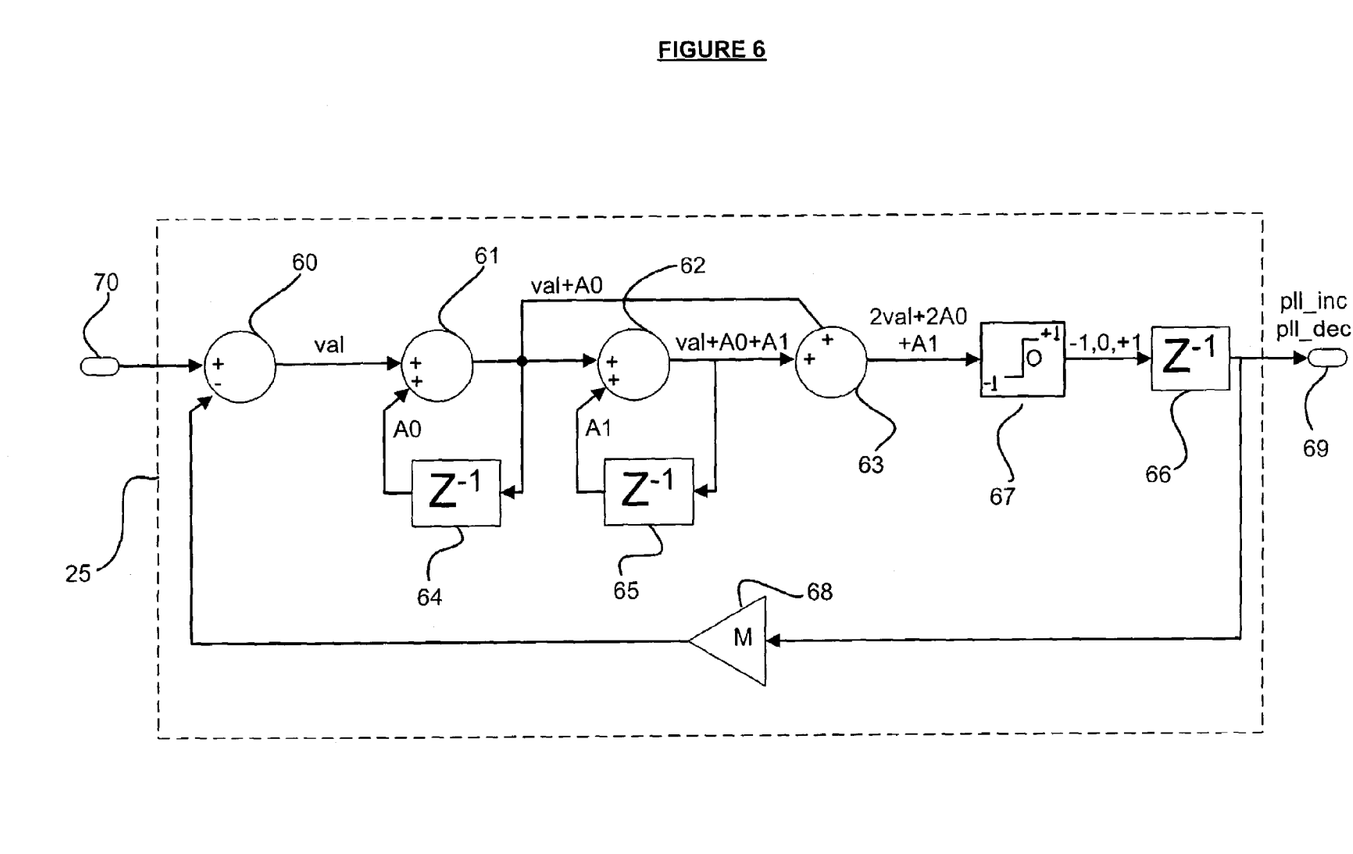
FIG. 6 is a block diagram representation of the Δ-Σ modulator (i.e. stuffing generator) of the synchronizer in accordance with the invention.

FIGS. 5 and 6 respectively depict in greater detail a DFLL 24 and a second order Δ-Σ modulator 25 (i.e. bit stuffing command generator) suitable for use in DSS 21.

DFLL 24 shown in FIG. 5 receives as input from FOMB 23 a frequency offset signal 50 that is input to adder 51. A feedback signal produced by delay element 58 is also input to adder 51, as illustrated, forming a first feedback loop. Adder 52 and delay element 53 together form an accumulator (i.e. integrator) the output of which reflects the FIFO fill level. The output signal produced by adder 52 is input to delay element 53, forming a second feedback loop. Adder 52's output signal is also input to scaler (i.e. amplifier) 54. The output signal produced by scaler 54 is input to downsampler register 55, which is triggered by downsampler timer 56—a simple wrapping timer. A measurement low pass filter output signal 57 is produced at the output of DFLL 24. Output signal 57 is fed back to delay element 58, which in turn sends its output signal to adder 51 as aforesaid.

DFLL 24 shown in FIG. 5 filters low-frequency jitter caused by FOMB 23's quantization operation, as aforesaid. Downsampler register 55 removes any biasing due to round-off errors caused by fixed-point processing. A limiter (not shown) within downsampler register 55 prevents application to the input of Δ-Σ modulator 25 of values exceeding the Δ-Σ parameter M (explained below). Such excess values could drive Δ-Σ modulator 25 outside its desired mode of operation.

The downsampler formed by downsampler register 55 and downsampler timer 56 synchronizes DFLL 24 and Δ-Σ modulator 25, taking into account the fact that DFLL 24's timing signal is supplied by measurement clock 26 whereas Δ-Σ modulator 25's timing signal is supplied by stuffing clock 27. These two clocks output different clock signals, although they are both synchronized with the system reference clock (not shown). For example, if the signal output by measurement clock 26 is 8 times higher than that output by stuffing clock 27 then downsampler register 55 selects every 8th signal output of scaler 54 in accordance with to a value determined by timer 56.

DFLL 24's transfer function H(z), and the cutoff frequency $f_{cutoff}$ of DSS 21 are given by:

$$H(z) = \frac{1}{K} * \frac{z}{z - \frac{K}{K-1}} \quad (3)$$

$$f_{cutoff} = \frac{f_s}{2\pi} * \frac{1}{K} \quad (4)$$

where $f_s$ is the measurement clock frequency, and the gain, G, of scaler (i.e. amplifier) 54 is G=1/K.

Referring now to FIG. 6, Δ-Σ modulator 25 incorporates subtracter 60; adders 61, 62, 63; delay elements 64, 65, 66; quantizer 67 and multiplier 68. Multiplier 68 multiplies Δ-Σ modulator 25's output signal 69 by a factor M. The resultant M-multiplied signal is applied to the "−" input of subtracter 60 to establish the interval over which subtracter 60 integrates the input signal 70 output by DFLL 24, resulting in output of a signal val by subtracter 60. Adder 61 adds the val signal output by subtracter 60 to the A0 signal output by delay element 64, resulting in output of a signal A0+val by adder 61. Adder 62 adds the A0+val signal output by adder 61 to the A1 signal output by delay element 65, resulting in output of a signal A0+A1+val by adder 62. Adder 63 adds the A0+A1+val signal output by adder 62 to the A0+val signal output by adder 61, resulting in output of a signal 2A0+A1+2val by adder 63. Quantizer 67 outputs −1, 0, or +1 depending on whether the signal 2A0+A1+2val output by adder 63 is respectively less than, between, or greater than the quantizer's threshold values $\pm[(M/2)+K_s]$, where M, $K_s$ are constants as hereinafter explained.

In a preferred embodiment $K_s$=36 and M=4,094. Therefore, $\pm[(M/2)+K_s]=\pm 2,083$. If the value output by adder 63 (i.e. 2A0+A1+2val) exceeds 2,083 then quantizer 67 outputs the value +1. If (2A0+A1+2val)<−2,083 then quantizer 67 outputs the value −1. If $-2,083 \leq (2A0+A1+2val) \leq 2,083$ then quantizer 67 outputs the value 0. See Riley et al "Delta-Sigma Modulation in Fractional-N Frequency Synthesis", *IEEE Journal of Solid-State Circuits* Vol. 28, No. 5, May 1993, pp. 553-559 for further details of (Δ-Σ) modulators, particularly factors affecting stability and overflow characteristics thereof.

The −1, 0, or +1 signals output by quantizer 67 are processed by delay element 66 which in turn outputs either a phase increment (pll_inc) command signal to insert a stuff bit into the mapped VC-11 or VC-12 in the output SONET/SDH data stream; or, a phase decrement (pll_dec) command signal to remove a stuff bit from the output data stream. Only one or the other of pll_inc or pll_dec can be asserted at one time to either speed up or slow down the output data stream. If neither pll_inc nor pll_dec are asserted then a null operation is performed, such that the output data stream's rate remains unaffected.

As will be apparent to those skilled in the art in the light of the foregoing disclosure, many alterations and modifications are possible in the practice of this invention without departing from the spirit or scope thereof. For example, different DFLLs and Δ-Σ modulators blocks may be used in substitution for those of FIGS. 5 and 6. As a further example, the foregoing description assumes a protocol which allows only one bit to be "stuffed" during each bit stuff/destuff opportunity. The invention is readily adapted to use with protocols allowing a plurality of bits to be stuffed during each bit stuff/destuff opportunity. This can be accomplished by replacing tri-level quantizer 67 with a multi-level quantizer, since stability and accuracy issues affecting the operation of multi-level quantizers in Δ-Σ modulators affect only analog implementations. The scope of the invention is to be construed in accordance with the substance defined by the following claims.

What is claimed is:

1. A signal synchronization mapper, for mapping an input data stream characterized by a first frequency into an output data stream characterized by a second frequency, said mapper comprising:
   (a) a frequency offset measurement block for producing a frequency offset output signal representative of frequency offset between:
      (i) a recovered clock signal representative of the frequency of said input data stream;
      (ii) a reference clock signal;
   (b) a frequency-locked loop coupled to receive and reduce jitter in said frequency offset output signal, and for producing a jitter-reduced output signal; and,
   (c) a Δ-Σ modulator external to and series-connected to said frequency-locked loop to receive and quantize said jitter-reduced output signal and for producing one of a preselected number of bit stuffing signals;
(d) a FIFO buffer coupled between said input and output data streams; and
(e) a FIFO adjuster coupled between said FIFO buffer and said frequency-locked loop, said FIFO adjuster for synchronizing said frequency-locked loop with said FIFO buffer;

wherein:
(f) said frequency offset measurement block operates at a measurement frequency;
(g) said Δ-Σ modulator operates at a stuffing frequency; and,
(h) said measurement frequency is not equal to said stuffing frequency.

2. A signal synchronization mapper as defined in claim 1, wherein said measurement frequency is greater than said stuffing frequency.

3. A signal synchronization mapper for mapping an input data stream characterized by a first frequency into an output data stream characterized by a second frequency, said mapper comprising:
(a) a frequency offset measurement block for producing a frequency offset output signal representative of frequency offset between:
  (i) a recovered clock signal representative of the frequency of said input data stream;
  (ii) a reference clock signal;
(b) a frequency-locked loop coupled to receive and reduce jitter in said frequency offset output signal, and for producing a jitter-reduced output signal; and,
(c) a Δ-Σ modulator external to and series-connected to said frequency-locked loop to receive and quantize said jitter-reduced output signal and for producing one of a preselected number of bit stuffing signals;
(d) a FIFO buffer coupled between said input and output data streams;
(e) a FIFO adjuster coupled between said FIFO buffer and said frequency-locked loop, said FIFO adjuster for synchronizing said frequency-locked loop with said FIFO buffer;
(f) an adder having:
  (i) a first input coupled to receive said frequency offset measurement block output signal;
  (ii) a second input coupled to receive an output signal produced by said FIFO adjuster;
  (iii) an output coupled to an input of said frequency-locked loop;
(g) said frequency-locked loop having an output coupled to an input of said Δ-Σ modulator; and,
(h) said Δ-Σ modulator having an output coupled to a timing controller for producing stuff, null or destuff commands corresponding to said respective bit stuffing signals.

4. A signal synchronization mapper as defined in claim 3, wherein said Δ-Σ modulator further comprises a multiplier having a multiplication factor M, said multiplier coupled between said Δ-Σ modulator input and said Δ-Σ modulator output.

5. A signal synchronization mapper as defined in claim 4, wherein:
(a) said Δ-Σ modulator further comprises a tri-level quantizer for producing said bit stuffing signals; and,
(b) said bit stuffing signals each further comprise a single bit stuff/destuff indicator for each bit stuff/destuff opportunity defined by a protocol characterizing data communication via said input and output data streams.

6. A signal synchronization mapper as defined in claim 5, wherein:
(a) said quantizer has a threshold characteristic $\pm[(M/2)+K_s]$, where $K_s$ is a pre-defined constant;
(b) said bit stuff/destuff indicator further comprises:
  (1) −1 when signals input to said quantizer are less than $-[(M/2)+K_s]$;
  (ii) 0 when signals input to said quantizer are between $-[(M/2)+K_s]$ and $+[(M/2)+K_s]$; and,
  (iii) +1 when signals input to said quantizer are greater than $+[(M/2)+K_s]$.

7. A signal synchronization mapper as defined in claim 4, wherein:
(a) said Δ-Σ modulator further comprises a multi-level quantizer for producing said bit stuffing signals; and,
(b) said bit stuffing signals further comprise a plurality of bit stuff/destuff indicators for each stuff/destuff opportunity defined by a protocol characterizing data communication via said input and output data streams.

8. A signal synchronization mapper for mapping an input data stream characterized by a first frequency into an output data stream characterized by a second frequency, said mapper comprising:
(a) a frequency offset measurement block for producing a frequency offset output signal representative of frequency offset between:
  (i) a recovered clock signal representative of the frequency of said input data stream;
  (ii) a reference clock signal;
(b) a frequency-locked loop coupled to receive and reduce jitter in said frequency offset output signal, and for producing a jitter-reduced output signal; and,
(c) a Δ-Σ modulator external to and series-connected to said frequency-locked loop to receive and quantize said jitter-reduced output signal and for producing one of a preselected number of bit stuffing signals;
(d) a FIFO buffer coupled between said input and output data streams;
(e) a FIFO adjuster coupled between said FIFO buffer and said frequency-locked loop, said FIFO adjuster for synchronizing said frequency-locked loop with said FIFO buffer;
said frequency-locked loop further comprising:
(f) a first adder for adding a first feedback signal to said frequency offset output signal to produce a first adder output signal;
(g) a second adder for adding a second feedback signal to said first adder output signal to produce a second adder output signal;
(h) an amplifier for amplifying said second adder output signal;
(i) a downsampler for synchronizing said frequency-locked loop and said Δ-Σ modulator;
(j) a first delay element coupled between an output of said downsampler and an input of said first adder, said first delay element for producing said first feedback signal; and,
(k) a second delay element coupled between an output of said second adder and an input of said second adder, said second delay element for producing said second feedback signal.

9. A signal synchronization mapper for mapping an input data stream characterized by a first frequency into an output data stream characterized by a second frequency said mapper comprising:

(a) a frequency offset measurement block for producing a frequency offset output signal representative of frequency offset between:
   (i) a recovered clock signal representative of the frequency of said input data stream;
   (ii) a reference clock signal;

(b) a frequency-locked loop coupled to receive and reduce jitter in said frequency offset output signal, and for producing a jitter-reduced output signal; and, (c) a Δ-Σ modulator external to and series-connected to said frequency-locked loop to receive and quantize said jitter-reduced output signal and for producing one of a preselected number of bit stuffing signals;

(d) a FIFO buffer coupled between said input and output data streams;

(e) a FIFO adjuster coupled between said FIFO buffer and said frequency-locked loop, said FIFO adjuster for synchronizing said frequency-locked loop with said FIFO buffer:

said Δ-Σ modulator further comprising:

(f) a subtracter for subtracting a first feedback signal from said jitter-reduced output signal to produce a val output signal;

(g) a first adder for adding said val output signal to an A0 feedback signal to produce a val+A0 output signal;

(h) a second adder for adding said val+A0 output signal to an A1 feedback signal to produce a val+A0+A1 output signal;

(i) a third adder for adding said val+A0 output signal to said val+A0+A1 output signal to produce a 2val+2A0+A1 output signal;

(j) a first delay element coupled between an output of said first adder and an input of said first adder, said first delay element for producing said A0 feedback signal;

(k) a second delay element coupled between an output of said second adder and an input of said second adder, said second delay element for producing said A1 feedback signal;

(l) a quantizer coupled to receive said 2val+2A0+A1 output signal, said quantizer for producing said bit stuffing signals;

(m) a third delay element coupled to an output of said quantizer, said third delay element for producing phase increment and phase decrement signals corresponding to said bit stuffing signals; and, (n) a multiplier coupled between an output of said third delay element and an input of said subtracter, said multiplied for multiplying said phase increment and phase decrement signals by a factor M.

* * * * *